(12) United States Patent
Ono et al.

(10) Patent No.: US 7,628,854 B2
(45) Date of Patent: Dec. 8, 2009

(54) PROCESS FOR PRODUCING SILICON SINGLE CRYSTAL

(75) Inventors: Toshiaki Ono, Tokyo (JP); Wataru Sugimura, Tokyo (JP); Takayuki Kubo, Tokyo (JP); Akira Higuchi, Tokyo (JP); Ken Nakajima, Tokyo (JP)

(73) Assignee: Sumco Corporation, Tokyo (JP)

( * ) Notice: Subject to any disclaimer, the term of this patent is extended or adjusted under 35 U.S.C. 154(b) by 0 days.

(21) Appl. No.: 11/486,508

(22) Filed: Jul. 14, 2006

(65) Prior Publication Data

US 2007/0017434 A1    Jan. 25, 2007

(30) Foreign Application Priority Data

Jul. 19, 2005    (JP)    ............................ P2005-208526

(51) Int. Cl.
*C30B 15/20*    (2006.01)

(52) U.S. Cl. .............................. 117/30; 117/13; 117/15; 117/20; 117/32

(58) Field of Classification Search ...................... 117/1; 257/1; 438/1
See application file for complete search history.

(56) References Cited

U.S. PATENT DOCUMENTS

| | | | | |
|---|---|---|---|---|
| 5,041,186 | A | * | 8/1991 | Nishio et al. ................... 117/15 |
| 6,210,477 | B1 | | 4/2001 | Izumi et al. |
| 2003/0056715 | A1 | * | 3/2003 | Tachikawa et al. ............ 117/30 |
| 2006/0249074 | A1 | * | 11/2006 | Sugimura et al. ............. 117/84 |

FOREIGN PATENT DOCUMENTS

| | | | |
|---|---|---|---|
| JP | 11-189488 | | 7/1999 |
| JP | 2001-130995 | * | 7/1999 |
| JP | 2001-130995 | | 5/2001 |
| JP | 2004-182525 | | 7/2004 |

* cited by examiner

*Primary Examiner*—Robert M Kunemund
(74) *Attorney, Agent, or Firm*—Kolisch Hartwell, P.C.

(57) ABSTRACT

A process for producing a silicon single crystal includes the steps of bringing a seed crystal into contact with a silicon melt, gradually pulling the seed crystal from the melt so as to form a neck having a tapered portion and a constant diameter portion, then pulling a silicon single crystal. The atmosphere used during neck formation is a hydrogen-containing atmosphere prepared by adding a hydrogen-containing substance to an inert gas. The hydrogen-containing substance has a hydrogen gas equivalent concentration in the hydrogen-containing atmosphere of 3 to 20%.

9 Claims, 4 Drawing Sheets

PRIOR ART

PRIOR ART

PROCESS FOR PRODUCING SILICON SINGLE CRYSTAL

BACKGROUND OF THE INVENTION

1. Field of the Invention

The present invention relates to a process for producing a silicon single crystal. More specifically, the invention relates to a silicon single crystal production process that enables the stable formation of a neck portion.

Priority is claimed on Japanese Patent Application No. 2005-208526, filed Jul. 19, 2005, the content of which is incorporated herein by reference.

2. Description of Related Art

There are a variety of methods for producing silicon single crystals. Of these, the Czochralski (CZ) method is widely used as a silicon single crystal pulling technique capable of commercial mass production.

FIG. 5 is a longitudinal sectional view of an apparatus for pulling silicon single crystal (a silicon single crystal puller) which uses the CZ method. As shown in FIG. 5, growth of the silicon single crystal is carried out in the vessel of a chamber 19, within which a crucible 11 is disposed at a central position. The crucible 11 is composed of a quartz receptacle 11a as an inner layer and, fitted on the outside thereof, a graphite receptacle 11b as an outer layer. A shaft for rotating and vertically raising and lowering the crucible 11 is provided at the base of the outer receptacle 11b of the crucible 11. A cylindrical heater 12 is disposed concentrically about the outer periphery of the crucible 11, and a crystal starting material melted by the heater 12, i.e., a polysilicon melt 13, is held within the crucible 11. Tubular thermal insulation 17 is provided outside of the heater 12 in such a way as to surround the heater 12.

Above the crucible 11, a pull shaft 14 is provided, in a manner that allows the rotation and vertical movement thereof, through a small cylindrically shaped pull chamber 20 formed on and connected to the top of the chamber 19, and a seed crystal 16 is detachably mounted on a seed chuck 15 at the bottom end of the pull shaft 14. The single crystal is grown from a bottom end of the seed crystal 16 by contacting the bottom end of the seed crystal 16 with the surface of the melt 13, then raising the seed crystal 16 while rotating it in the opposite direction to rotation by the crucible 11.

When the seed crystal 16 is brought into contact with the surface of the silicon melt 13 as shown in FIG. 5, the resulting thermal shock generates a high density of dislocations in the seed crystal 16. To pull a silicon single crystal in a dislocation-free state, a neck is provided below the seed crystal 16 and pulling is carried out while using the so-called Dash technique to eliminate generated dislocations from the surface of the crystal and allow dislocation-free crystal to solidify at the bottom end of the neck.

FIG. 6 shows the shape of the neck provided below the seed crystal 16 during pulling by the CZ method. Normally, with regard to the neck 16n that is formed during pulling of the silicon single crystal, as shown in FIG. 6, the seed crystal 16 is brought into contact with the surface of the silicon melt 13 then is pulled upward, causing the bottom end thereof to gradually neck, forming a tapered portion $16n_1$ of decreasing diameter, following which a constant diameter portion $16n_2$ of a specific diameter is formed. Hence, the neck 16n is made up the tapered portion $16n_1$ and the constant diameter portion $16n_2$. Generally, to make a silicon single crystal dislocation-free, it is thought to be necessary for the constant diameter portion $16n_2$ of the neck 16n to have a diameter D of about 3 mm or less and a length L of at least 30 mm.

The success rate for eliminating dislocations from a neck 16n having a constant diameter portion $16n_2$ with a diameter of 3 mm or less is about 70%. Hence, a desire exists for further improvement in this success rate.

Recently, requirements having to do with the efficient production of wafers for semiconductors have increased the need for larger diameter and greater length in the silicon single crystals being pulled. As a result, in the case of 12-inch crystals, for example, it is expected that the weight of the single crystals will exceed 300 kg.

When a silicon single crystal is pulled, the weight of the crystal is supported by the neck. Hence, the entire weight of the single crystal depends from the constant diameter portion of the neck. According to calculations based on the mechanical characteristics of silicon single crystals, supporting a crystal having a large weight in excess of 300 kg would require that the constant diameter portion of the neck have a diameter of at least 4.5 mm. Including also a margin of safety to cover vibrations and shocks in the pulling process, a diameter of 6.0 mm is required. Unless the neck is provided with a strength on this order, there is a strong possibility that the neck will break during pulling of the single crystal, causing the silicon single crystal to drop, which is a serious accident. On the other hand, the success rate for eliminating dislocations from the neck drops sharply when the constant diameter portion has a diameter of 4 mm or more.

JP-A 11-189488 discloses, as a means for preventing the silicon single crystal from falling yet achieving an improved success rate for the formation of a dislocation-free neck, a method in which an auxiliary heating mechanism is used to heat the neck during dislocation elimination by the Dash technique and thereby control the temperature distribution in the neck, alleviating thermal stress that acts on the neck and making it possible to render the silicon single crystal dislocation-free even when the neck has a relatively large diameter.

JP-A 2001-130995 describes a method of stably forming a neck having a diameter of about 4 to 10 mm by controlling the silicon melt temperature and the seed crystal pull rate.

Patent Reference 1: Japanese Unexamined Patent Application, First Publication No. Hei 11-189488 (referred to as JP-A 11-189488)

Patent Reference 2: Japanese Unexamined Patent Application, First Publication No. 2001-130995 (referred to as JP-A 2001-130995)

Using the method described in JP-A 11-189488 would require that an auxiliary heating mechanism be included in the apparatus for pulling silicon single crystal, which would have the undesirable effect of increasing the size of the overall crystal pulling system.

As for the method described in JP-A 2001-130995, because the neck has a relatively large diameter of 4 to 10 mm, the success rate for achieving a dislocation-free state is only about 15%. Further improvement in the success rate is thus desired.

It is therefore an object of the invention to provide a silicon single crystal production process which is capable of further improving the success rate for eliminating dislocations.

SUMMARY OF THE INVENTION

In order to achieve the object, the invention provides a process for producing a silicon single crystal, which process includes the steps of bringing a seed crystal into contact with a silicon melt, gradually pulling the seed crystal from the melt so as to form a neck having a tapered portion and a constant diameter portion, then pulling a silicon single crystal; wherein the atmosphere used during neck formation is a hydrogen-containing atmosphere prepared by adding a hydrogen-containing substance to an inert gas.

In one preferred aspect of the inventive process for producing a silicon single crystal, the hydrogen-containing substance has a hydrogen gas equivalent concentration in the hydrogen-containing atmosphere of 3 to 20%.

In another preferred aspect of the inventive process, the hydrogen-containing substance is hydrogen gas, and the hydrogen-containing atmosphere has a hydrogen gas concentration of 3 to 20%.

In the inventive process for producing a silicon single crystal, it is preferable for the constant diameter portion of the neck to be controlled to a diameter of up to 3 mm.

In yet another preferred aspect of the inventive process, the constant diameter portion of the neck is controlled to a diameter of 4 to 10 mm and the seed crystal is pulled at a rate of 2.5 mm/min or higher during formation of the constant diameter portion.

As used herein, "hydrogen-containing substance" refers to a gaseous substance which contains hydrogen atoms within the molecules thereof and which, when dissolved in the silicon melt, thermally decomposes to generate hydrogen gas. The hydrogen-containing substance may be hydrogen gas itself. The hydrogen concentration within the silicon melt can be increased by mixing such a hydrogen-containing substance into an inert gas, and introducing the resulting mixture into the atmosphere used during neck formation. Illustrative examples of hydrogen-containing substances include hydrogen atom-containing inorganic compounds such as hydrogen gas, $H_2O$, and HCl; and other types of hydrogen atom-containing compounds such as silane gases, hydrocarbons such as $CH_4$ and $C_2H_2$, and hydrogen atom-containing organic compounds such as alcohols and carboxylic acids. The use of hydrogen gas is especially preferred. The inert gas is preferable argon gas, which is inexpensive. Other inert gases that may be used include various rare gases such as helium, neon, krypton and xenon, either alone or as mixed gases thereof.

In the present invention, the hydrogen gas equivalent concentration of the hydrogen-containing substance in the hydrogen-containing atmosphere is set in a range of 3 to 20%. The concentration is expressed as the hydrogen gas equivalent concentration because the amount of hydrogen atoms obtainable such as by thermal decomposition of the hydrogen-containing substance is governed at least in part by the number of hydrogen atoms originally present in the hydrogen-containing substance. For example, a mole of $H_2O$ contains one mole of $H_2$, but a mole of HCl contains only 0.5 mole of $H_2$. Hence, in the practice of the invention, it is desirable to use as a standard the hydrogen-containing atmosphere prepared by the addition of a 3 to 20% concentration of hydrogen gas to an inert gas, and to set the concentration of the hydrogen-containing substance so that an atmosphere equivalent to this atmosphere serving as the standard is obtainable. The preferred hydrogen-containing substance concentration at this time is one that has been specified as a hydrogen gas equivalent concentration.

That is, in the practice of the invention, the amount of hydrogen-containing substance added may be adjusted so that, assuming that the hydrogen-containing substance dissolves in the silicon melt, undergoes thermal decomposition in the high-temperature silicon melt and is converted to atomic hydrogen, the hydrogen gas equivalent concentration in the atmosphere after such conversion is in a range of 3 to 20%.

In the inventive method of producing a single-crystal silicon, by forming a neck in a hydrogen-containing atmosphere prepared by adding a hydrogen-containing substance having a hydrogen gas equivalent concentration of 3 to 20% to an inert gas, hydrogen atoms from the hydrogen-containing substance dissolve into the silicon melt and those hydrogen atoms are taken up interstitially in the silicon when the silicon solidifies. The interstitial uptake of hydrogen by the silicon "fixes" within the neck dislocations that were created by thermal shock when the seed crystal touched the silicon melt, and can also prevent the generation of new dislocations. That is, by adding the hydrogen-containing substance, both the propagation of dislocations within the neck and the generation of dislocations can be stopped.

As a result, the propagation of dislocations to a shoulder and body of the crystal which are formed after the neck is prevented, enabling the efficient production of a dislocation-free silicon single crystal.

Generally, when the solid-liquid interface between the silicon melt and the seed crystal is downwardly convex, it is possible to promote the elimination of dislocations in the neck. However, by incorporating hydrogen in the silicon melt, this dislocation eliminating effect can be further promoted.

Also, in the inventive process for producing a single crystal silicon, by forming the neck in a hydrogen-containing atmosphere and giving the constant diameter portion of the neck a diameter of up to 3 mm, the success rate for eliminating dislocations by forming a neck can be raised to substantially 100%.

Furthermore, in the inventive process for producing a single crystal silicon, by forming the neck within a hydrogen-containing atmosphere, controlling the constant diameter portion of the neck to a diameter of 4 to 10 mm, and setting the single crystal pull rate during formation of the constant diameter portion to at least 2.5 mm/min or higher, the success rate for eliminating dislocations by forming a neck having a constant diameter portion with a diameter of 4 mm or more can be greatly increased relative to the prior art.

The inventive process for producing single crystal silicon enables the success rate for eliminating dislocations to be improved even further by carrying out neck formation in a hydrogen-containing atmosphere.

DETAILED DESCRIPTION OF THE INVENTION

Embodiments of the invention are described below in conjunction with the accompanying diagrams.

Construction of CZ Furnace

Figure 1:
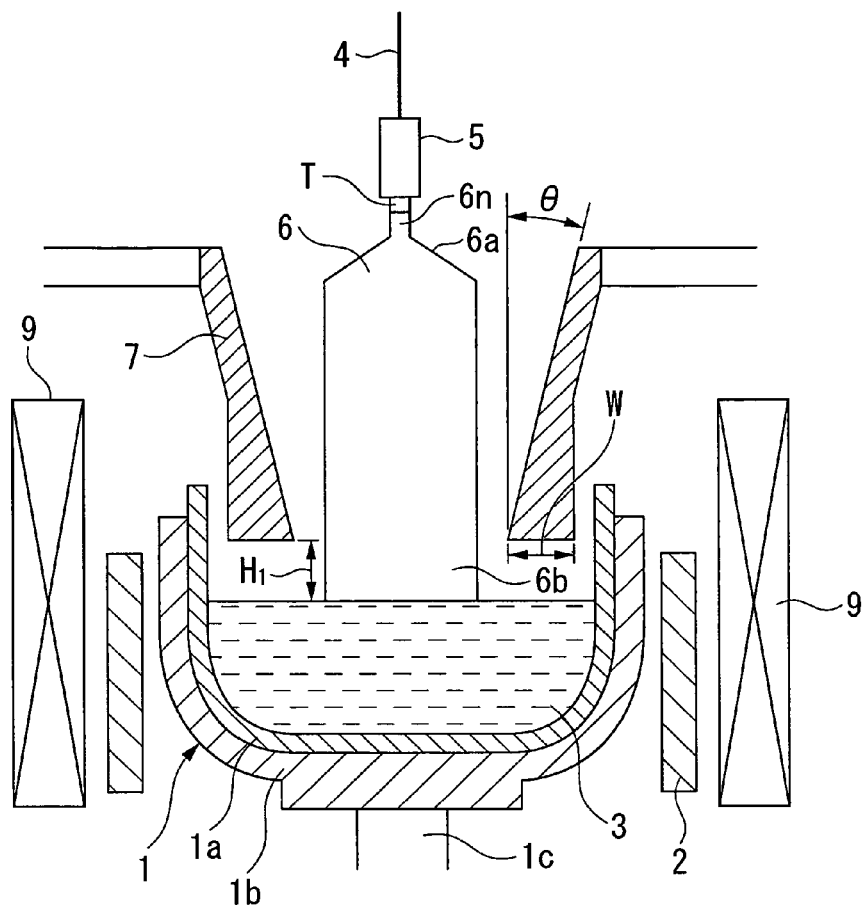
FIG. 1 is a schematic longitudinal sectional view of an apparatus for pulling silicon single crystal (CZ furnace) such as may be used when carrying out a silicon single crystal production process according to one embodiment of the invention.

FIG. 1 is a longitudinal sectional view of an apparatus for pulling silicon single crystal (CZ furnace) suitable for carrying out the silicon single crystal production processes according to the embodiments of the invention.

The CZ furnace (silicon single crystal puller) shown in FIG. 1 has a crucible 1 which is centrally located within a chamber, a heater 2 disposed outside of the crucible 1, and a magnetic field generator 9 disposed outside of the heater 2. The crucible 1 has a double construction composed of an inner quartz crucible 1a which holds therein a silicon melt 3 and is itself held within an outer graphite crucible 1b. The crucible 1 is rotated and vertically driven by a supporting shaft 1c commonly referred to as a pedestal.

A cylindrical heat shield 7 is provided above the crucible 1. The heat shield 7 is composed of an outer graphite shell filled on the inside with a graphite felt. The heat shield 7 has an inner face which is tapered so that the inside radius gradually decreases from the top edge to the bottom edge. The outer face at the top of the heat shield 7 is tapered to match the inner face and the outer face at the bottom is formed as a substantially straight face, so that the thickness of the heat shield 7 gradually increases in the downward direction.

A seed crystal T mounted on a seed chuck 5 is dipped in the silicon melt 3, then pulled upward while the crucible 1 and a pull shaft 4 are rotated, enabling the formation of a silicon single crystal 6. The silicon single crystal 6 shown in FIG. 1 is composed of a neck 6n that has formed below the seed crystal T, a shoulder 6a that has formed after the neck 6n, and a body 6b that has formed after the shoulder 6a.

The heat shield 7, which blocks heat radiation from the heater 2 and the surface of the silicon melt 3 to the lateral surface of the silicon single crystal 6, surrounds the lateral surface of the silicon single crystal 6 being grown and also surrounds the surface of the silicon melt 3. Exemplary specifications for the heat shield 7 are as follows. For example, the heat shield 7 may have a width (thickness) W in the radial direction of 50 mm at the bottom end thereof, an inner face shaped as an inverted cone with an inclination θ to the vertical of 21°, and a bottom end height $H_1$ above the surface of the melt of 60 mm.

In a horizontal magnetic field, the strength of the magnetic field applied by the magnetic field generator 9 is set within a range of 2,000 to 4,000 G (0.2 to 0.4 T), and preferably 2,500 to 3,500 G (0.25 to 0.35 T), and the center height of the magnetic field relative to the liquid surface of the melt is set within a range of −150 to +100 mm, and preferably −75 to +50 mm.

Alternatively, in a cusp magnetic field, the strength of the magnetic field applied by the magnetic field generator 9 is set within a range of 200 to 1,000 G (0.02 to 0.1 T), and preferably 300 to 700 G (0.03 to 0.07 T), and the center height of the magnetic field relative to the surface of the melt is set within a range of −100 to +100 mm, and preferably −50 to +50 mm.

By using the magnetic field generator 9 to supply a magnetic field having a strength and a center height in the above-indicated ranges, it is possible to suppress convection and thus impart to the solid-liquid interface a desirable shape.

(Silicon Single Crystal Production Process According to a First Embodiment)

Next, a process for producing a silicon single crystal 6 according to a first embodiment of the invention is described wherein the apparatus for pulling silicon single crystal(CZ furnace) shown in FIG. 1 is used and the single crystal growing atmosphere is a mixed gas composed of an inert gas and a hydrogen-containing substance.

First, the crucible 1 is charged with, for example, 300 kg of high-purity polycrystalline silicon, and a p-type dopant (e.g., boron, aluminum, gallium) or n-type dopant (e.g., phosphorus, arsenic, antimony) is added to set the resistivity of the single crystal to the desired value, such as 10 Ω.cm.

The interior of the CZ furnace is placed under a hydrogen-containing ambient composed of a mixed gas of a hydrogen-containing substance and an inert gas, the ambient pressure within the furnace is set to 1.3 to 13.3 kPa (10 to 100 torr), and the hydrogen gas equivalent concentration of the hydrogen-containing substance within the ambient gas is set to 3 to 20%. When hydrogen gas is selected as the hydrogen-containing substance, the hydrogen gas concentration should be set to 3 to 20%. If the total pressure (ambient pressure within furnace) has been set to from 1.3 to 13.3 kPa, the hydrogen partial pressure at this time will be in a range of 39 Pa to 2.7 kPa.

A hydrogen gas equivalent concentration (hydrogen concentration) for the hydrogen-containing substance of less than 3% (i.e., a hydrogen partial pressure of less than 39 Pa) is undesirable because it may not be possible to reduce the propagation of dislocations introduced into the silicon and the generation of new dislocations. Moreover, a higher hydrogen gas equivalent concentration (hydrogen concentration) of the hydrogen-containing substance results in a larger dislocation generation suppressing effect. However, a hydrogen gas equivalent concentration above 50% (which corresponds to a hydrogen partial pressure of 6.75 kPa) is undesirable for safety reasons because of the increased danger of a mishap such as a detonation should an oxygen leak occur in the CZ furnace. Even a concentration above 20% (which corresponds to a hydrogen partial pressure of 2.7 kPa) is undesirable because, although detonation will not occur, at this level there remains an increased risk of combustion. At a hydrogen concentration of 20% or less, should an incident such as a oxygen leak occur, combustion may occur within the furnace, but this does not present a safety concern because the change in pressure during such combustion will not exceed 1 atmosphere. Accordingly, the hydrogen-containing substance (hydrogen gas) concentration is preferably in a range of 3 to 20%, and more preferably in a range of 3 to 10%.

The hydrogen-containing substance is a material which thermally decomposes when dissolved in the silicon melt and supplies hydrogen atoms to the silicon melt. This hydrogen-containing substance, when mixed with an inert gas and introduced into the atmosphere at the time of neck formation, is able to raise the hydrogen concentration within the silicon melt. Illustrative examples of the hydrogen-containing substance include hydrogen atom-containing inorganic compounds such as hydrogen gas, $H_2O$, and HCl; and various other types of hydrogen-containing substances such as silane gases, hydrocarbons (e.g., $CH_4$, $C_2H_2$), alcohols and carboxylic acids. Of these, the use of hydrogen gas is especially preferred. The inert gas is preferably argon, which is inexpensive. Other inert gases that may be used include various rare gases such as helium, neon, krypton and xenon, either alone or as a mixed gas thereof.

If oxygen gas ($O_2$) is present in the inert atmosphere, it may be present in a concentration such that the concentration difference between the hydrogen molecule equivalent concentration of the gas and twice the oxygen gas concentration is at least 3 vol %. If the concentration difference between the hydrogen molecule equivalent concentration of the hydrogen atom-containing gas and twice the concentration of the oxygen gas is less than 3 vol %, the crystal originated particle (COP) and grown-in defect (e.g., dislocation cluster) generation suppressing effects of the hydrogen atoms introduced into the silicon crystal may be unobtainable.

If the concentration of nitrogen present as an impurity in the inert gas is high, dislocations will be generated in the silicon crystal. Therefore, within a normal furnace internal pressure range of 1.3 to 13.3 kPa (10 to 100 torr), it is preferable to set the nitrogen concentration to not more than 20%.

Next, a horizontal magnetic field of 3,000 G (0.3 T), for example, is applied by the magnetic field generator 9 at a magnetic field center height of from −75 to +50 mm relative to the liquid surface of the melt. At the same time, polycrystalline silicon is heated by a heater 2, turning it into a silicon melt 3.

A seed crystal T mounted on a seed chuck 5 is then dipped in the silicon melt 3, and crystal pulling is carried out while rotating the crucible 1 and the pull shaft 4, initially forming a neck 6n. The crystal orientation during pulling may be {100}, {111} or {110}.

Figure 2:
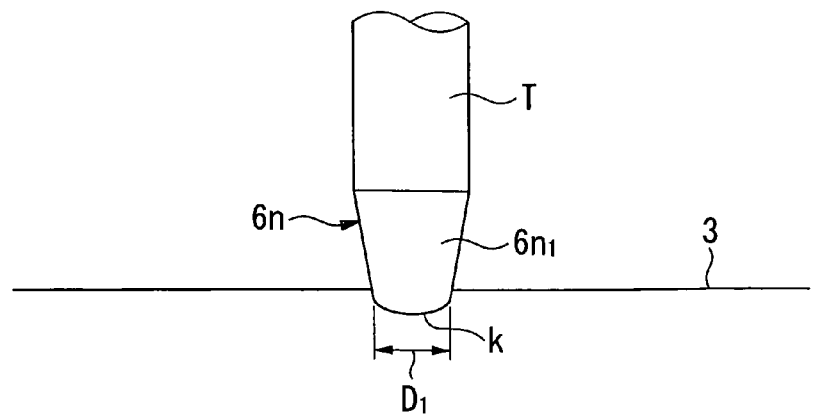
FIG. 2 is a schematic view of a neck which illustrates a process for producing a silicon single crystal according to one embodiment of the invention.

Formation of the neck 6n is described in detail. By dipping the seed crystal T in the silicon melt 3, then pulling up the seed crystal T while rotating the crucible 1 and the pull shaft 4, a tapered portion $6n_1$, is formed, as shown in FIG. 2. It is desirable for the pull rate at this time to be in a range of 1.0 to 2.5 mm/min. This tapered portion $6n_1$ is part of the neck 6n and is pulled in such a way that the diameter gradually decreases in the direction opposite to the pulling direction. In the present embodiment, it is preferable to carry out formation of the tapered portion $6n_1$, to a minimum diameter $D_1$ of 3 mm or less.

Figure 3:
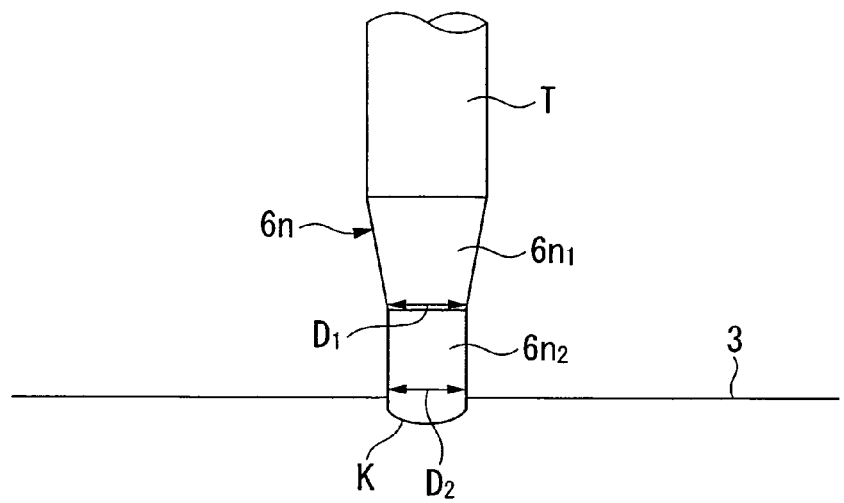
FIG. 3 is a schematic view of a neck which illustrates a process for producing a silicon single crystal according to another embodiment of the invention.

Next, after the diameter $D_1$ at the end of the tapered portion $6n_1$ has decreased to 3 mm or less, the pull rate is set in a range of 2.0 to 4.0 mm/min and pulling is continued, thereby forming the constant diameter portion $6n_2$ as shown in FIG. 3. This constant diameter portion $6n_2$ forms, together with the tapered portion $6n_1$, the neck 6n, and has been pulled so as to make the diameter uniform in the pulling direction or the opposite direction thereto. In the present embodiment, it is desirable for the diameter $D_2$ of the constant diameter portion $6n_2$ to be set to 3 mm or less, and for the length of the constant diameter portion $6n_2$ to be set to at least 5 mm. This completes formation of the neck 6n.

Figure 4:
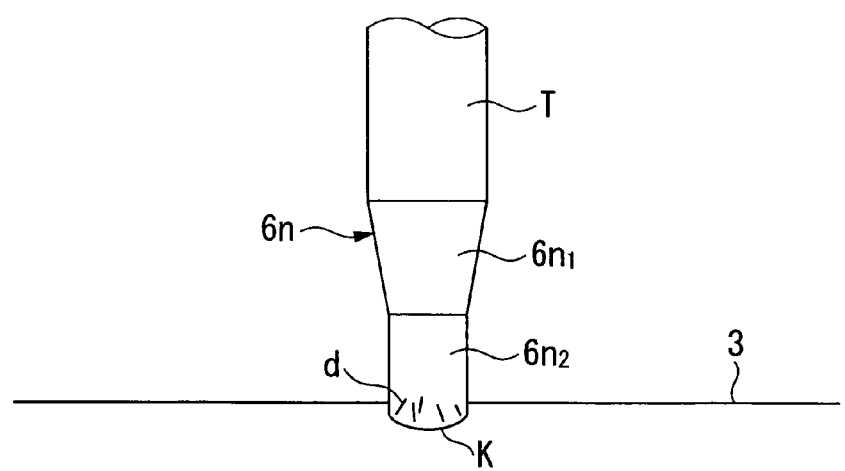
FIG. 4 is a schematic view of a neck which illustrates a process for producing a silicon single crystal according to yet another embodiment of the invention.
Figure 5:
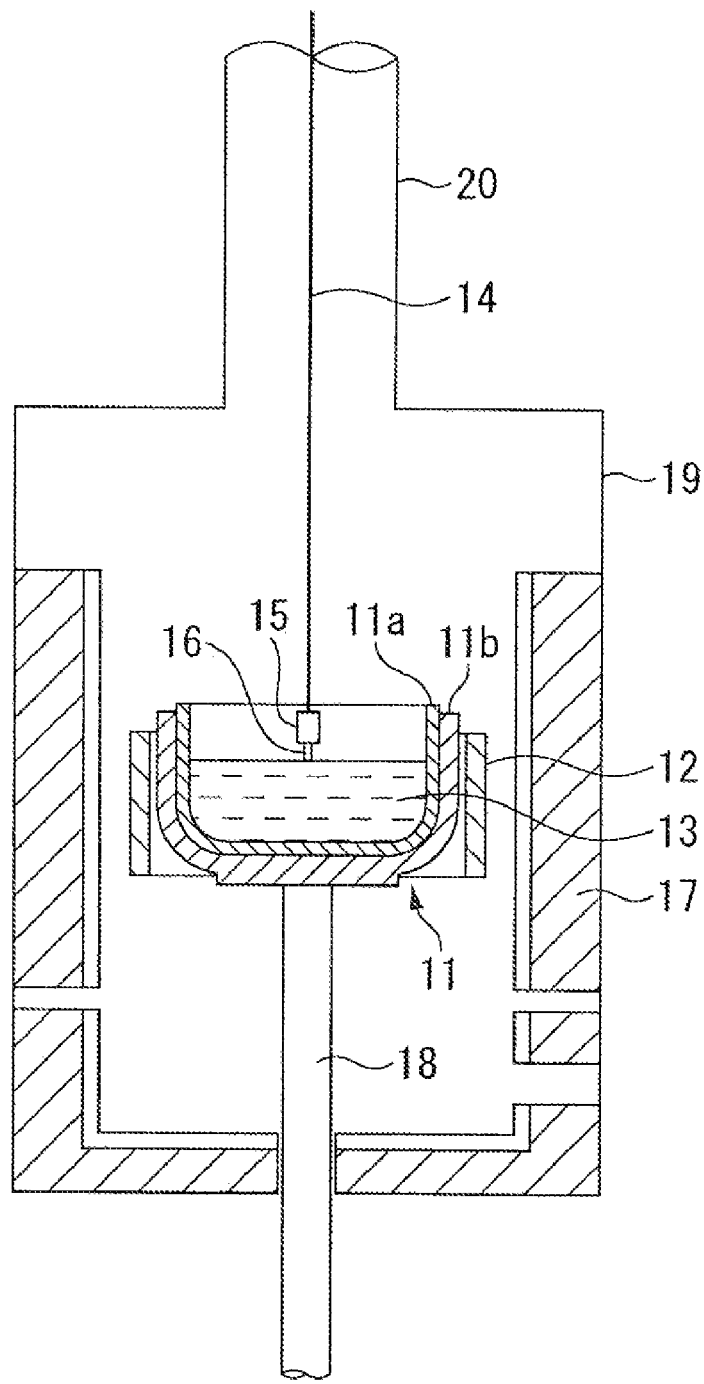
FIG. 5 is a schematic longitudinal sectional view of an apparatus for pulling silicon single crystal (CZ furnace) such as typically used when carrying out a prior-art silicon single crystal production process.
Figure 6:
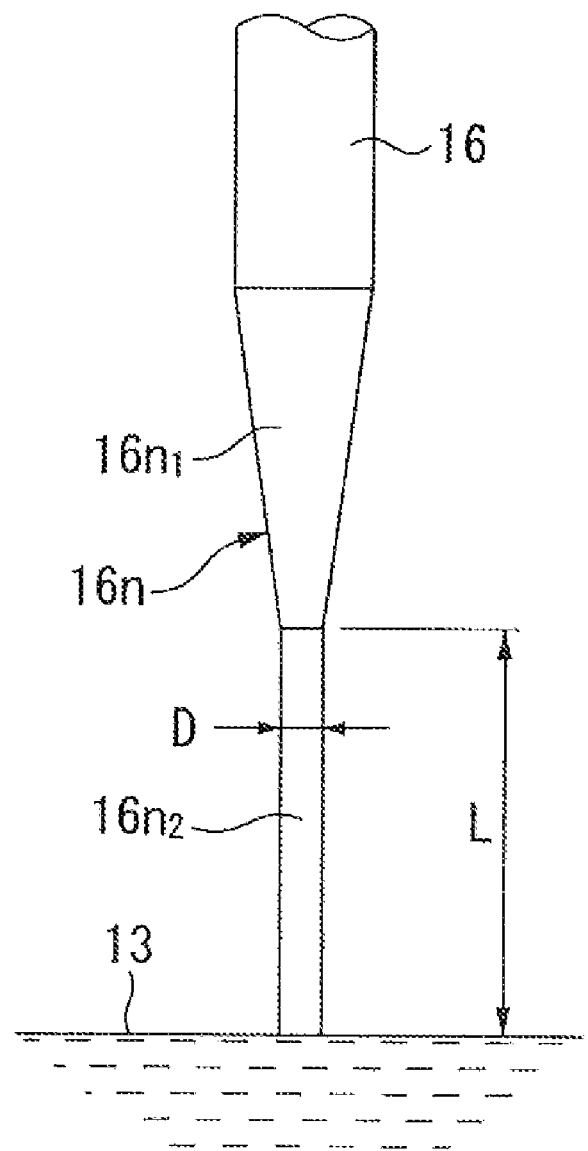
FIG. 6 is schematic view of a neck which illustrates a silicon single crystal production process according to the prior art.

During formation of the neck 6n, it is preferable for the solid-liquid interface K between the silicon melt 3 and the seed crystal T, or the solid-liquid interface K between the silicon melt 3 and the neck 6n being formed, to continue to maintain a downwardly convex shape which projects toward the silicon melt 3 side. As shown in FIG. 4, because dislocations d introduced into the silicon by thermal shock when the seed crystal T comes into contact with the silicon melt 3 have the property of growing in a direction normal to the solid-liquid interface K, by making the solid-liquid interface K downwardly convex, the dislocations d that have been introduced can be induced to grow out to the surface of the neck 6n and thereby eliminated.

Once formation of the neck 6n is finished, the atmosphere within the CZ furnace may be changed from a hydrogen-containing atmosphere to an atmosphere which includes no hydrogen-containing substances (e.g., a 100% inert gas atmosphere), or formation of the subsequently described shoulder 6a and body 6b may be carried out while maintaining a hydrogen-containing atmosphere.

Next, the crucible 1 and seed crystal 5 rotation rates and the pull rate are adjusted so as to form a shoulder 6a where the crystal cross-section is grown out to the target body diameter.

When the body has reached a length of 300 mm, for example, the pull rate is adjusted to a rate, such as 1.0 mm/min, that is sufficiently higher than the critical rate. Next, the pull rate is lowered in a substantially linear manner in accordance with the pull length so that the pull rate falls below the critical rate, to 0.3 mm/min for example, once the body has reached a length of, say, 600 mm. The body 6b is then grown to a length of perhaps 1,600 mm at this pull rate and tailing is carried out under normal conditions, after which crystal growth is brought to an end.

In the process for producing a silicon single crystal according to the present embodiment, the constant diameter portion $6n_2$ of the neck 6n has a diameter $D_2$ of 3 mm or less, which is relatively advantageous for eliminating dislocations. At the same time, by having the atmosphere during formation of the neck 6n be a hydrogen-containing atmosphere, it is possible to both stop the propagation of existing dislocations and also prevent the generation of new dislocations within the neck 6n, enabling more effective prevention of the propagation of dislocations to the body 6b. The reason is as follows. By forming the neck 6n in a hydrogen-containing atmosphere, hydrogen from the hydrogen-containing substance dissolves into the silicon melt 3. When the silicon solidifies, this hydrogen is taken up interstitially by the silicon. As a result, the dislocations generated by thermal shock when the seed crystal T comes into contact with the silicon melt 3 are "fixed" within the neck 6n, in addition to which the generation itself of dislocations can be prevented.

Hence, in the present embodiment, the success rate for eliminating dislocations by forming the neck 6n can be raised from the prior-art level of about 70% to substantially 100%.

(Silicon Single Crystal Production Process According to a Second Embodiment)

Next, a process for producing a silicon single crystal 6 according to a second embodiment of the invention is described wherein the CZ furnace shown in FIG. 1 is used and a mixed gas composed of an inert gas and a hydrogen-containing substance is used as the ambient gas for growing the single crystal.

First, as in the first embodiment, the crucible 1 is charged with, for example, 300 kg of high-purity polycrystalline silicon, and a p-type dopant (e.g., boron, aluminum, gallium) or n-type dopant (e.g., phosphorus, arsenic, antimony) is added to set the resistivity of the single crystal to the desired value, such as 10 Ω·cm.

Also, as in the first embodiment, the CZ furnace is placed under a hydrogen-containing ambient composed of a mixed gas of a hydrogen-containing substance and an inert gas.

Next, a horizontal magnetic field of 3,000 G (0.3 T), for example, is applied by the magnetic field generator 9 at a magnetic field center height of from −75 to +50 mm relative to the liquid surface of the melt, and polycrystalline silicon is heated by a heater 2, turning it into a silicon melt 3. The temperature of the silicon melt at this time is preferably the temperature at which the diameter at the bottom end of the seed crystal T does not decrease when the seed crystal T is brought into contact with the silicon melt 3 and pulled upward at a pull rate of 1.5 mm/min.

As used herein, "the temperature at which the diameter at the bottom end of the seed crystal T does not decrease when the seed crystal T is brought into contact with the silicon melt 3 and pulled upward at a pull rate of 1.5 mm/min" refers to liquid temperature conditions for the silicon melt 3 such that, when the seed crystal has been brought into contact with the silicon melt 3 and pulling has started, at a pull rate of 1.5 mm/min, the diameter at the bottom end of the seed crystal at least does not decrease; that is, pulling take place with the bottom end of the seed crystal either remaining at the same diameter or gradually increasing in diameter. If the silicon melt 3 reaches a high-temperature state that exceeds the above-indicated temperature, it will not be possible to make the shape of the solid-liquid interface during formation of the tapered portion of the neck $6n$ sufficiently downwardly convex, thus preventing a dislocation-free state from being achieved.

As mentioned above, because dislocations introduced into the silicon by thermal shock when the seed crystal T is brought into contact with the silicon melt 3 have the property of growing in a direction normal to the solid-liquid interface K, by making the solid-liquid interface K downwardly convex, the dislocations can be induced to grow out to the surface of the neck $6n$ and thereby eliminated.

The seed crystal T that has been mounted on the seed chuck 5 is then dipped in the silicon melt 3, and crystal pulling is carried out while rotating the crucible 1 and the pull shaft 4, initially forming a neck $6n$. As in the first embodiment, the crystal orientation during pulling may be {100}, {111} or {110}.

Formation of the neck is described in detail. As in FIG. 2, to which reference was made in describing the first embodiment, a tapered portion $6n_1$ is formed by dipping the seed crystal T in the silicon melt 3, then pulling up the seed crystal T while rotating the crucible 1 and the pull shaft 4. It is desirable for the pull rate at this time to be at least 2.5 mm/min. This tapered portion $6n_1$ is part of the neck $6n$ and is pulled in such a way that the diameter gradually decreases in the direction opposite to the pulling direction. In the present embodiment, it is preferable to carry out formation of the tapered portion $6n_1$ to a diameter $D_1$ of 4 to 10 mm.

In this embodiment, there are two reasons for setting the pull rate of the tapered portion $6n_1$ to at least 2.5 mm/min. The first is that, because the dislocations that have been introduced into the silicon crystal grow toward the solid-liquid interface which moves as pulling proceeds, if the crystal is pulled at a higher rate than the growth rate of the dislocations, it will be impossible to reduce the dislocation density. The second reason is that, to eliminate dislocations by utilizing the downwardly convex state of the solid-liquid interface K in the neck $6n$ forming step, the pull length over which the downwardly convex state is maintained must be extended to some degree. For example, to eliminate dislocations near the center of the crystal, it is necessary to induce the dislocations to move in the radial direction over a distance equal to the crystal radius. The longer the distance moved in the pull direction, the greater the distance the dislocations can be moved in the radial direction. Therefore, by ensuring the distance of movement in the pull direction, the dislocation density can be reliably decreased. Moreover, to achieve a long distance of movement in the pull direction over which the solid-liquid interface is in a downwardly convex state, it is effective to increase the pull rate. Making the pull rate faster will decrease the length of time during which the solid-liquid interface is in a downwardly convex state, but the pull length-decreasing effect of the shortened time with the interface in a downwardly convex state is exceeded by the distance of movement-extending effect in the pull direction of the faster pull rate with the solid-liquid interface in a downwardly convex state.

In the practice of the present invention, even when the constant diameter portion $6n_2$ of the neck $6n$ is given a large diameter of 4.5 mm or more, as noted above, by setting the liquid temperature of the silicon melt to a relatively low temperature and setting the pull rate during formation of the tapered portion $6n$ of the neck $6n$ to 2.5 mm/min or more, dislocations that have been introduced into the crystal can be reliably eliminated. That is, by setting the pull rate to 2.5 mm/min or more, even dislocations present near the center of the seed crystal can be eliminated from the crystal via the downwardly convex solid-liquid interface.

The upper limit in the pull rate is determined by, of various neck $6n$ formation defects, the occurrence of a completely necked down state where the crystal separates from the melt. Generally, it is desirable to set the upper limit to 6 mm/min when a magnetic field is not applied to the silicon melt 3, and to 10 mm/min when a magnetic field is applied. When a magnetic field is applied to the silicon melt 3, the pull rate has a higher upper limit because temperature fluctuations in the melt are smaller, making it more difficult for complete necking down to occur.

Next, as in FIG. 3 which is referred to in the first embodiment, once the diameter at the end of the tapered portion $6n_1$ has reached 4.5 to 10 mm, the pull rate is then set in a range of 2.5 to 4.0 mm/min and pulling is continued, thereby forming a constant diameter portion $6n_2$. This constant diameter portion $6n_2$ constitutes, together with the tapered portion $6n_1$, the neck $6n$, and is pulled so that the diameter in the pulling direction or the opposite direction thereto is uniform. In the present embodiment, it is desirable for the diameter $D_2$ of the constant diameter portion $6n_2$ to be set at from 4.5 to 10 mm, and for the length of the constant diameter portion $6n_2$ to be set to at least 10 mm. This completes formation of the neck $6n$.

As in the first embodiment, during formation of the neck $6n$ it is preferable for the solid-liquid interface K between the silicon melt 3 and the seed crystal T, or the solid-liquid interface K between the silicon melt 3 and the neck $6n$ being formed, to continue to maintain a downwardly convex shape. By making the solid-liquid interface K downwardly convex, the dislocations that have been introduced can be induced to grow out to the surface of the neck $6n$ and thereby eliminated.

Once formation of the neck $6n$ is finished, the atmosphere within the CZ furnace may be changed from a hydrogen-containing atmosphere to an atmosphere which includes no hydrogen-containing substances (e.g., a 100% inert gas atmosphere), or formation of the shoulder $6a$ and body $6b$ may be carried out while maintaining a hydrogen-containing atmosphere.

The shoulder $6a$ and body $6b$ are then formed as in the first embodiment and tailing is carried out under normal conditions, after which crystal growth is brought to an end.

In the process for producing a silicon single crystal according to the present embodiment, the constant diameter portion $6n_2$ of the neck $6n$ has a diameter $D_2$ of 4.5 to 10 mm, which is relatively disadvantageous for eliminating dislocations. At the same time, by having the atmosphere during formation of the neck $6n$ be a hydrogen-containing atmosphere, it is possible to both stop the propagation of existing dislocations and also prevent the generation of new dislocations within the neck $6n$, enabling more effective prevention of the propagation of dislocations to the body $6b$. The reason is as follows. By forming the neck $6n$ in a hydrogen-containing atmosphere, hydrogen from the hydrogen-containing substance dissolves into the silicon melt 3. When the silicon solidifies, this hydrogen is taken up interstitially by the silicon. As a result, the dislocations generated by thermal shock when the seed crystal T comes into contact with the silicon melt 3 are "fixed" within the neck $6n$, in addition to which the generation itself of dislocations can be prevented.

Hence, in the present embodiment, the success rate for eliminating dislocations by forming the neck $6n$ can be markedly increased.

EXAMPLES

Silicon single crystal ingots were produced by the CZ method under the conditions described below in Examples 1 to 9, and the success rate for eliminating dislocations by means of the neck were examined in each of the obtained ingots.

In each example, two CZ furnaces were used ten times each to conduct a total of twenty production tests, thereby producing twenty ingots. Each ingot was examined to determine whether success had been achieved in obtaining a dislocation-free state, and the results obtained were used to compute the success rate for eliminating dislocations.

The success or failure in achieving a dislocation-free state was assessed by cutting the constant diameter portion from the neck and examining it by x-ray topography.

Example 1

The crucible 1 shown in FIG. 1 was charged with 300 kg of high-purity polycrystalline silicon, and boron was added as a p-type dopant to give the single crystal a resistivity of 12 Ωcm.

Next, the interior of the CZ furnace was placed under an argon gas atmosphere, and the ambient pressure was set at 4.0 kPa.

A 3,000 G horizontal magnetic field was then applied by a magnetic field generator 9 at a magnetic field center height, relative to the liquid surface of the melt, of from −75 to +50 mm. At the same time, the polycrystalline silicon was heated with a heater 2 to form a silicon melt 3.

Next, a 15 mm diameter seed crystal T was mounted on a seed chuck 5, the seed crystal T was dipped in the silicon melt 3, and crystal pulling was carried out while rotating the crucible 1 and the pull shaft 4 at respective speeds of 2 rpm and 4 rpm in mutually opposing directions. The orientation of the crystal being pulled was set at {100}.

Pulling involved first dipping the seed crystal T in the silicon melt 3, then carrying out pulling at a pull rate of 2.4 mm/min to a diameter of 3 mm to form a tapered portion.

Next, the pull rate was set to 3.2 mm/min and pulling was continued, thereby forming a constant diameter portion having a diameter of 3 mm and a length of 7 mm. In this way, a neck composed of a tapered portion and a constant diameter portion was formed.

After formation of the neck, the neck was separated from the silicon melt and removed from the CZ furnace. The constant diameter portion was then furnished for an assessment of the dislocation-free state.

Example 2

The crucible 1 shown in FIG. 1 was charged with 300 kg of high-purity polycrystalline silicon, and boron was added as a p-type dopant to give the single crystal a resistivity of 12 Ωcm.

Next, the interior of the CZ furnace was placed under an argon gas atmosphere, and the ambient pressure was set to 4.0 kPa.

A 3,000 G horizontal magnetic field was then applied by a magnetic field generator 9 at a magnetic field center height, relative to the liquid surface of the melt, of from −75 to +50 mm. At the same time, the polycrystalline silicon was heated with a heater 2 to form a silicon melt 3. The temperature of the silicon melt was set at "the temperature at which the diameter at the bottom end of the seed crystal T does not decrease when the seed crystal T is brought into contact with the silicon melt 3 and pulled upward at a pull rate of 1.5 mm/min."

Next, a 15 mm diameter seed crystal T was mounted on a seed chuck 5, the seed crystal T was dipped in the silicon melt 3, and crystal pulling was carried out while rotating the crucible 1 and the pull shaft 4 at respective speeds of 2 rpm and 4 rpm in mutually opposing directions. The orientation of the crystal being pulled was set at {100}.

Pulling involved first dipping the seed crystal T in the silicon melt 3, then carrying out pulling at a pull rate of 2.2 mm/min to a diameter of 5 mm to form a tapered portion.

Next, the pull rate was set to 2.8 mm/min and pulling was continued, thereby forming a constant diameter portion having a diameter of 5 mm and a length of 12 mm. In this way, a neck composed of a tapered portion and a constant diameter portion was formed.

After formation of the neck, the neck was separated from the silicon melt and removed from the CZ furnace. The constant diameter portion was then furnished for an assessment of the dislocation-free state.

Example 3

Aside from making the atmosphere within the CZ furnace a hydrogen-containing atmosphere prepared by mixing a 1% concentration of hydrogen into argon gas, setting the pull rate during formation of the constant diameter portion to 2.6 mm/min, and setting the diameter of the constant diameter portion to 5.2 mm, neck formation was carried out in the same way as in Example 2. The resulting neck was furnished for an assessment of the dislocation-free state.

Example 4

Aside from making the atmosphere within the CZ furnace a hydrogen-containing atmosphere prepared by mixing a 3% concentration of hydrogen into argon gas, neck formation was carried out in the same way as in Example 1. The resulting neck was furnished for an assessment of the dislocation-free state.

Example 5

Aside from making the atmosphere within the CZ furnace a hydrogen-containing atmosphere prepared by mixing a 3% concentration of hydrogen into argon gas, setting the pull rate during formation of the constant diameter portion to 2.7 mm/min, and setting the diameter of the constant diameter portion to 5.4 mm, neck formation was carried out in the same way as in Example 2. The resulting neck was furnished for an assessment of the dislocation-free state.

Example 6

Aside from making the atmosphere within the CZ furnace a hydrogen-containing atmosphere prepared by mixing a 3% concentration of hydrogen into argon gas, setting the pull rate during formation of the constant diameter portion to 2.5 mm/min, and setting the diameter of the constant diameter portion to 8.9 mm, neck formation was carried out in the same way as in Example 2. The resulting neck was furnished for an assessment of the dislocation-free state.

Example 7

Aside from making the atmosphere within the CZ furnace a hydrogen-containing atmosphere prepared by mixing a 6% concentration of hydrogen into argon gas, setting the pull rate during formation of the constant diameter portion to 2.6 mm/min, and setting the diameter of the constant diameter portion to 8.1 mm, neck formation was carried out in the same way as in Example 2. The resulting neck was furnished for an assessment of the dislocation-free state.

Example 8

Aside from making the atmosphere within the CZ furnace a hydrogen-containing atmosphere prepared by mixing a 6% concentration of hydrogen into argon gas, setting the pull rate during formation of the constant diameter portion to 2.1 mm/min, and setting the diameter of the constant diameter portion to 8.0 mm, neck formation was carried out in the same way as in Example 2. The resulting neck was furnished for an assessment of the dislocation-free state.

Example 9

Aside from making the atmosphere within the CZ furnace a hydrogen-containing atmosphere prepared by mixing a 18% concentration of hydrogen into argon gas, setting the pull rate during formation of the constant diameter portion to 3.2 mm/min, and setting the diameter of the constant diameter portion to 9.1 mm, neck formation was carried out in the same way as in Example 2. The resulting neck was furnished for an assessment of the dislocation-free state.

The success rates for the elimination of dislocations in the respective examples are shown in Table.

TABLE 1

|  | $H_2$ concentration of atmosphere (%) | Diameter of constant diameter portion (mm) | Pull rate in formation of constant diameter portion (mm/min) | Success rate for elimination of dislocations (%) |
|---|---|---|---|---|
| Example 1 | 0 | 3 | 3.2 | 70 |
| Example 2 | 0 | 5 | 2.8 | 15 |
| Example 3 | 1 | 5.2 | 2.6 | 0 |
| Example 4 | 3 | 3 | 3.2 | 100 |
| Example 5 | 3 | 5.4 | 2.7 | 90 |
| Example 6 | 3 | 8.9 | 2.5 | 90 |
| Example 7 | 6 | 8.1 | 2.6 | 95 |
| Example 8 | 6 | 8.0 | 2.1 | 25 |
| Example 9 | 20 | 9.1 | 3.2 | 95 |

As can be seen in Table 1, Examples 1 and 4 are examples in which the diameter of the constant diameter portion was set to 3 mm, and thus correspond to the first embodiment of the invention.

On comparing Examples 1 and 4, it is apparent that by introducing 3% of hydrogen in Example 4, the success rate for the elimination of dislocations was increase to 100% from the level of 70% in Example 1.

As shown in Table 1, Examples 2 and 3 and 5 to 9 are examples in which the diameter of the constant diameter portion was set to 4.5 mm or more, and thus correspond to the second embodiment of the invention.

On comparing Examples 2 and 3 with Examples 5 to 7 and 9, it is apparent that by introducing 3 to 20% of hydrogen in Examples 5 to 7 and 9, the success rate for eliminating dislocations was raised to a level of 90 to 95% from the level of 0 to 15% in Examples 2 and 3.

Also, on comparing Examples 7 and 8, it is apparent that by setting the pull rate for the constant diameter portion in Example 7 to 2.6 mm/min, as opposed to the pull rate of 2.1 m/min in Example 8, the success rate for the elimination of dislocations was raised to 95% from a level of 25% in Example 8.

The above examples thus demonstrate that by carrying out neck formation in a hydrogen-containing atmosphere, the success rate for the elimination of dislocations can be improved.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. For example, hydrogen gas can be supplied to the CZ furnace through a specialized line from a commercial source such as a hydrogen gas cylinder, a hydrogen gas storage tank, or a hydrogen tank containing a hydrogen occlusion alloy in which hydrogen has been stored. Accordingly, the invention is not to be considered as being limited by the foregoing description, and is only limited by the scope of the appended claims.

What is claimed is:

1. A process for producing a silicon single crystal, comprising the steps of bringing a seed crystal into contact with a silicon melt, gradually pulling the seed crystal from the melt so as to form a neck having a tapered portion and a constant diameter portion, then pulling a silicon single crystal;

wherein the atmosphere used during neck formation is a hydrogen-containing atmosphere prepared by adding a hydrogen-containing substance to an inert gas which has a concentration of nitrogen as an impurity of not more than 20%;

a horizontal magnetic field is applied to the silicon melt by a magnetic field generator, the horizontal magnetic field having a strength set within a range of 2,000 to 4,000 G and a center height relative to the liquid surface of the melt set within a range of −150 to +100 mm; and a cusp magnetic field is applied to the silicon melt by the magnetic field generator, the cusp magnetic field having a strength set within a range of 200 to 1,000 G and a center height relative to the surface of the melt set to be within a range of −100 to +100 mm.

2. The process according to claim 1, wherein the hydrogen-containing substance has a hydrogen gas equivalent concentration in the hydrogen-containing atmosphere of 3 to 20%.

3. The process according to claim 1, wherein the hydrogen-containing substance is hydrogen gas, and the hydrogen-containing atmosphere has a hydrogen gas concentration of 3 to 20%.

4. The process according to claim 1, wherein the constant diameter portion of the neck is controlled to a diameter of up to 3 mm.

5. The process according to claim 2, wherein the constant diameter portion of the neck is controlled to a diameter of up to 3 mm.

6. The process according to claim 3, wherein the constant diameter portion of the neck is controlled to a diameter of up to 3 mm.

7. The process according to claim 1, wherein the constant diameter portion of the neck is controlled to a diameter of 4 to 10 mm and the seed crystal is pulled at a rate of 2.5 mm/min or higher during formation of the constant diameter portion.

8. The process according to claim 2, wherein the constant diameter portion of the neck is controlled to a diameter of 4 to 10 mm and the seed crystal is pulled at a rate of 2.5 mm/min or higher during formation of the constant diameter portion.

9. The process according to claim 3, wherein the constant diameter portion of the neck is controlled to a diameter of 4 to 10 mm and the seed crystal is pulled at a rate of 2.5 mm/min or higher during formation of the constant diameter portion.

* * * * *